US009209761B2

(12) United States Patent
Manandhar et al.

(10) Patent No.: US 9,209,761 B2
(45) Date of Patent: Dec. 8, 2015

(54) COMBINED INPUT STAGE FOR TRANSCONDUCTANCE AMPLIFIER HAVING GAIN LINEARITY OVER INCREASED INPUT VOLTAGE RANGE

(71) Applicant: Texas Instruments Incorporated, Dallas, TX (US)

(72) Inventors: Sanjeev Manandhar, Tucson, AZ (US); Gary S. Gibson, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 59 days.

(21) Appl. No.: 13/930,764

(22) Filed: Jun. 28, 2013

(65) Prior Publication Data

US 2015/0002222 A1 Jan. 1, 2015

(51) Int. Cl.
*H03F 3/45* (2006.01)
*H03F 3/21* (2006.01)
*H03F 1/32* (2006.01)

(52) U.S. Cl.
CPC .............. *H03F 3/211* (2013.01); *H03F 1/3211* (2013.01); *H03F 3/4508* (2013.01); *H03F 3/45085* (2013.01)

(58) Field of Classification Search
CPC ........................................................ H03F 3/45
USPC ................................. 330/252, 254, 257, 261
See application file for complete search history.

(56) References Cited

U.S. PATENT DOCUMENTS

| | | | | |
|---|---|---|---|---|
| 3,452,289 | A * | 6/1969 | Ryan | 330/254 |
| 4,672,326 | A * | 6/1987 | Cini et al. | 330/254 |
| 6,057,714 | A * | 5/2000 | Andrys et al. | 327/105 |
| 7,420,497 | B2 * | 9/2008 | Chiu | 341/155 |
| 7,557,658 | B2 * | 7/2009 | Perez | 330/255 |
| 8,143,948 | B2 * | 3/2012 | Moraveji | 330/255 |

* cited by examiner

*Primary Examiner* — Henry Choe
(74) *Attorney, Agent, or Firm* — William B. Kempler; Frank D. Cimino

(57) ABSTRACT

First and second transconductance amplifier input stages having first and second gain characteristics, respectively, are combined. The resulting combined input stage has a third gain characteristic with a linear range that is larger than a linear range of either of the first and second gain characteristics.

15 Claims, 2 Drawing Sheets

15 V+ I1 I2 V+ 16 18 82 83 Ib Ib 17 19 72 73 11 13 70 71 V1 V2 74 78 81 Ib 75 76 77 79 V1 V2 V- V-

COMBINED INPUT STAGE FOR TRANSCONDUCTANCE AMPLIFIER HAVING GAIN LINEARITY OVER INCREASED INPUT VOLTAGE RANGE

FIELD

The present work relates generally to transconductance amplifiers and, more particularly, to the input stage of a transconductance amplifier.

BACKGROUND

A transconductance (Gm) amplifier generates an output current as a function of the difference between two input voltages. An input stage, such as a differential transistor pair or a class AB circuit, produces a pair of currents in response to the input voltages. A second (output) stage, such as a current mirror, generates an output current equal (or proportional) to the difference between the pair of currents.

The large signal gain of a transconductance amplifier with a differential pair input stage has a limited linear range, and flattens out substantially as the input voltage difference becomes large. The large signal gain with a class AB input stage has a limited linear range, and increases substantially as the input voltage difference becomes large. It is known that the linear range of either of the aforementioned amplifiers may be substantially increased by providing degeneration resistors in the input stage. However, the gain itself is reduced when the degeneration resistors are present. Other solutions use FETs instead of bipolar transistors in the differential pair or class AB circuit. This improves the linearity of the amplifier gain but, again, at the cost of reduced gain.

It is desirable in view of the foregoing to provide for increasing the linear range of a transconductance amplifier without reducing its gain.

DETAILED DESCRIPTION

Figure 1:
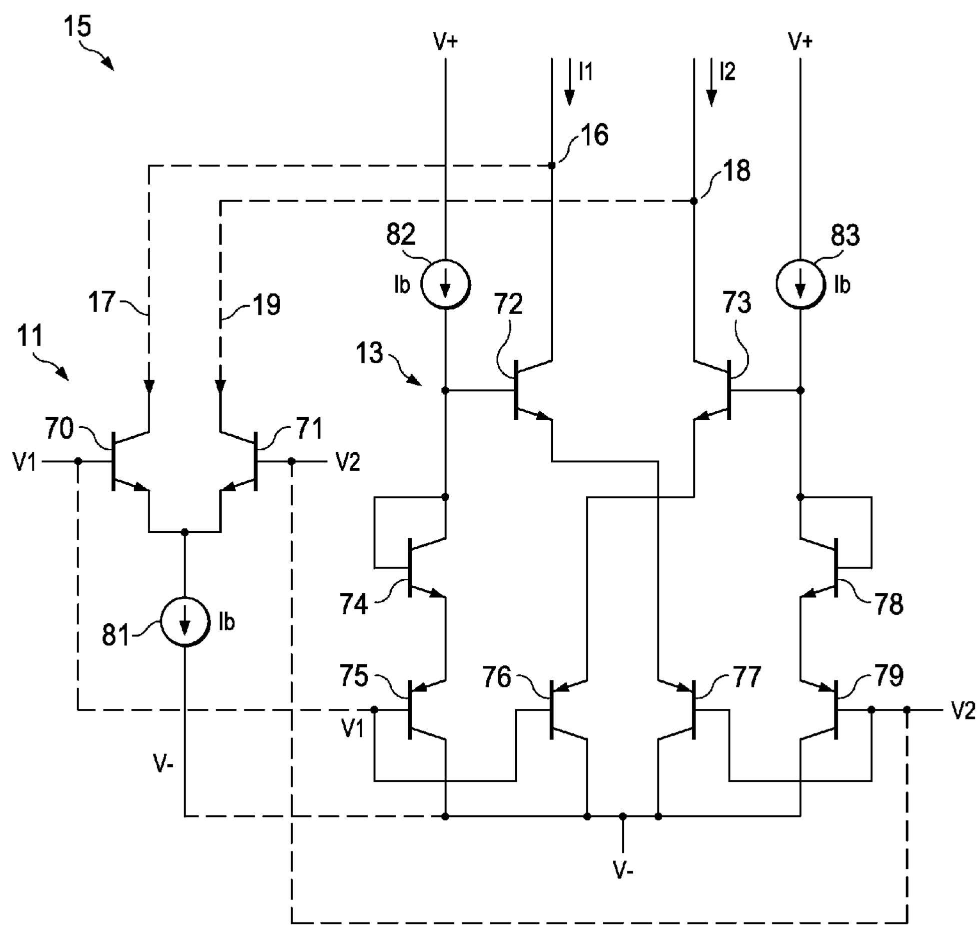
FIG. 1 diagrammatically illustrates a transconductance amplifier input stage according to example embodiments of the present work.

The present work recognizes that the linear range of a transconductance amplifier may be increased, without suffering gain reduction, by providing an input stage that combines characteristics of the differential pair and class AB input stages. FIG. 1 diagrammatically illustrates a transconductance amplifier input stage 15 according to example embodiments of the present work. In the example of FIG. 1, the input stage 15 includes a conventional differential pair input stage 11, suitably coupled (as shown by broken line) to a conventional class AB input stage 13. In the example of FIG. 1, the constituent input stages 11 and 13 are implemented with bipolar transistors. The input voltage nodes V1 of the respective input stages 11 and 13 are connected. Likewise, the input voltage nodes V2 are connected, the drains 16 and 17 are connected, the drains 18 and 19 are connected, and the negative power supply nodes V− are connected. The pair of currents produced by the combined input stage 15 are shown at I1 and I2. Positive power supply nodes are shown at V+.

The conventional differential pair 11 includes transistors 70 and 71 connected as shown to a current source 81, and connected as shown to nodes 17 and 18, respectively. The V1 input is connected as shown to control transistor 70, and the V2 input is connected as shown to control transistor 71. The current source 81 is connected as shown to V− and transistors 70 and 71.

The conventional class AB stage 13 includes transistors 72-79. Transistors 72 and 77 are connected as shown in series between node 16 and V−. Transistors 73 and 76 are connected as shown in series between node 18 and V−. Transistors 74 and 75 are connected as shown in series between a current source 82 and V−. Transistors 78 and 79 are connected as shown in series between a current source 83 and V−. The V1 input is connected as shown to control transistors 75 and 76, and the V2 input is connected as shown to control transistors 77 and 79. The current source 82 is connected as shown to V+ and transistors 72 and 74. The current source 83 is connected as shown to V+ and transistors 73 and 78.

Figure 2:
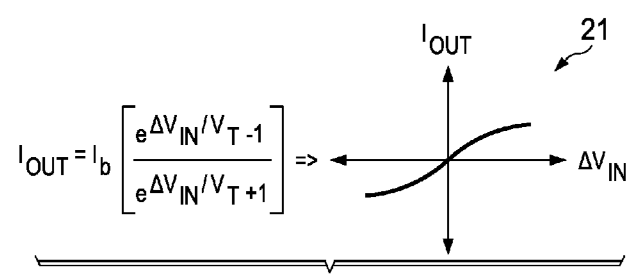
FIGS. 2 and 3 illustrate gain characteristics of respective constituent components of the input stage of FIG. 1.

Considering now the differential pair circuit 11 alone, its large signal equation is shown in FIG. 2. In FIG. 2, Iout is the difference between the pair of drain currents at nodes 17 and 19 in FIG. 1 when the circuit 11 is considered alone. Also in FIG. 2, the current Ib is the bias current, $\Delta V_{IN}$=V1-V2, and $V_T$ is thermal voltage (approximately 26 mV at room temperature). The gain of the differential pair circuit 11 alone, shown graphically at 21 in FIG. 2, has a linear range generally centered around $\Delta V_{IN}=0$, and flattens out substantially for larger $\Delta V_{IN}$, as previously described. That is, the gain 21 loses its linear characteristic for larger $\Delta V_{IN}$.

Figure 3:
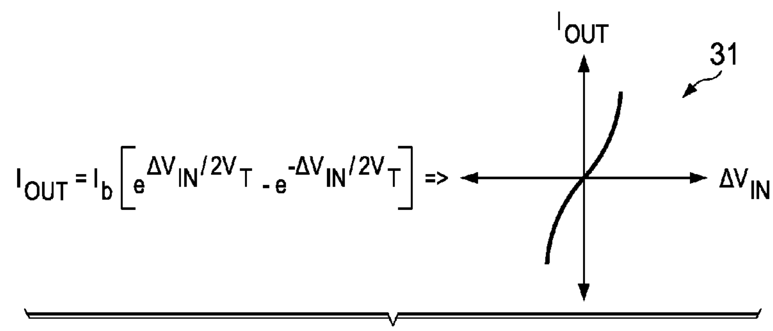

Considering now the class AB circuit 13 alone, its large signal equation is shown in FIG. 3, together with its gain shown graphically at 31. In FIG. 3, Iout is the difference between the pair of drain currents at nodes 16 and 18 in FIG. 1 when the circuit 13 is considered alone. The gain 31 has a linear range generally centered around $\Delta V_{IN}=0$, and increases substantially for larger $\Delta V_{IN}$, as mentioned previously. That is, the gain 31 loses its linear characteristic for larger $\Delta V_{IN}$.

Figure 4:
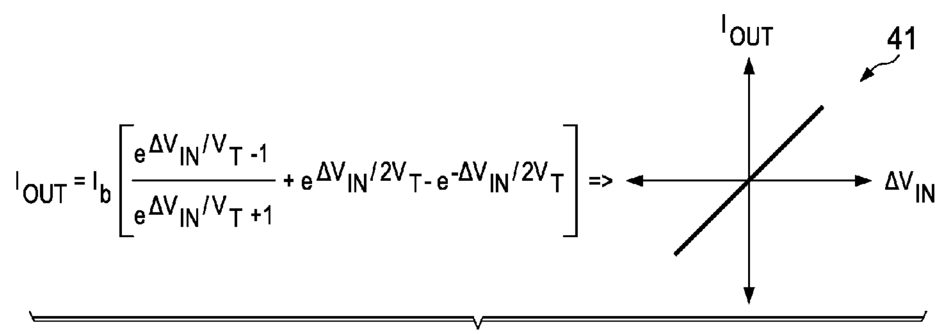
FIG. 4 illustrates a gain characteristic of the input stage of FIG. 1.

The combined input stage 15 of FIG. 1 combines characteristics of the circuits 11 and 13 to provide a substantial increase in the linear range of the gain (as compared to either circuit 11 or 13 alone) without gain reduction. The large signal equation for combined input stage 15 is shown in FIG. 4. In the equation of FIG. 4, Iout is I1-I2 in FIG. 1, which is the sum of Iout from FIG. 2 (described above) and Iout from FIG. 3 (described above). The non-linear portions of the gain characteristics 21 and 31 combine to produce an extension of the linear range (as compared to either gain characteristic 21 or 31). The gain characteristic for the combined input stage 15 is shown graphically at 41 in FIG. 4. The gain characteristics at 21, 31 and 41 in FIGS. 2-4 are simplified representations provided to illustrate pertinent attributes for purposes of comparison, and should not be understood to illustrate actual performance or simulation data.

Considering again the differential pair 11 alone, each transistor is operated quiescently at Ib/2. Considering the class AB circuit 13 alone, each transistor is operated quiescently at Ib. In the combined input stage 15, each transistor is operated quiescently at 3*Ib/2. If gain gm is defined as Iout/$\Delta V_{IN}$, it can be shown that, in the limit as $\Delta_{IN}\rightarrow 0$:

$$\text{for circuit } \mathbf{11},\ gm = Ib/(2\,V_T) \tag{1}$$

$$\text{for circuit } \mathbf{13},\ gm = Ib/V_T \tag{2}$$

$$\text{for circuit } \mathbf{15},\ gm = 3*Ib/(2\,V_T) \tag{3}$$

Consider an example with a desired gm of $0.001=10^{-3}$ mhos, $V_T$=26 mV, and $\Delta V_{IN}=V_T/2$=13 mV. Equations (1)-(3) above may be combined with the respectively corresponding equations of FIGS. 2-4 to yield:

$$\text{for circuit } \mathbf{11},\ Gm=Iout/\Delta V_{IN}=0.9796746496\times10^{-3}$$

$$\text{for circuit } \mathbf{13},\ Gm=1.010449367\times10^{-3}$$

$$\text{for circuit } \mathbf{15},\ Gm=1.00019106\times10^{-3}.$$

The differential pair 11, considered alone, thus provides gain 2% below desired, while the class AB circuit 13, considered alone, provides gain 1% above desired, and the combined input stage 15 provides gain 0.02% above desired.

Figure 5:
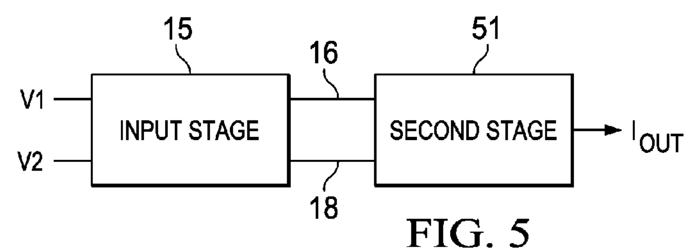
FIG. 5 diagrammatically illustrates a transconductance amplifier according to example embodiments of the present work.

FIG. 5 diagrammatically illustrates a transconductance amplifier according to example embodiments of the present work, wherein the combined input stage 15 of FIG. 1 is coupled, at nodes 16 and 18, to a second (output) stage 51 that produces the output current Iout. In some embodiments, the stage 51 is a conventional current mirror. In some embodiments, Iout=I1-I2 (see also FIG. 1).

Although example embodiments of the present work have been described above in detail, this does not limit the scope of the work, which can be practiced in a variety of embodiments.

What is claimed is:

1. An input stage for a transconductance amplifier, comprising:

a first transconductance amplifier input stage having a first differential input signal gain characteristic that decreases with absolute value of a differential input signal; and a second transconductance amplifier input stage having a second differential input signal gain characteristic different from said first differential signal gain characteristic and which increases with absolute value of the differential input signal;

wherein said first input stage is coupled to said second input stage for summing the gain characteristics of the first and second transconductance amplifier input stages to form a combined input stage having a third differential input signal gain characteristic with a linear range that is larger than a linear range of either of the first and second gain characteristics.

2. The input stage of claim 1, wherein the first input stage is a differential pair input stage and the second input stage is a class AB input stage.

3. The input stage of claim 1, wherein the first input stage is a class AB input stage.

4. The input stage of claim 1, wherein the first input stage has a first pair of voltage inputs respectively connected to a second pair of voltage inputs of the second input stage.

5. The input stage of claim 4, wherein the first and second input stages are configured to produce, respectively, first and second pairs of currents in response to the first and second pairs of voltage inputs, respectively, and wherein said first pair of currents are respectively produced at a first pair of nodes that are respectively connected to a second pair of nodes at which said second pair of currents are respectively produced.

6. The input stage of claim 1, wherein the first and second input stages are implemented with bipolar transistors.

7. A transconductance amplifier, comprising:

an input stage; and an output stage coupled to said input stage;

wherein said input stage is a combined input stage that includes a first transconductance amplifier input stage having a first gain characteristic, and a second transconductance amplifier input stage having a second gain characteristic, wherein said first input stage is coupled to said second input stage to form said combined input stage, and wherein said combined input stage has a third gain characteristic with a linear range that is larger than a linear range of either of the first and second gain characteristics, wherein input stage has a first pair of voltage inputs respectively connected to a second pair of voltage inputs of the second input stage and the first and second input stages are configured to produce, respectively, first and second pairs of currents in response to the first and second pairs of voltage inputs, respectively, and wherein said first pair of currents are respectively produced at a first pair of nodes that are respectively connected to a second pair of nodes at which said second pair of currents are respectively produced, and wherein said output stage produces an output current proportional to a sum of first and second differences between said first and second pairs of currents, respectively.

8. The transconductance amplifier of claim 7, wherein the first input stage is a differential pair input stage.

9. The transconductance amplifier of claim 8, wherein the second input stage is a class AB input stage.

10. The transconductance amplifier of claim 7, wherein the first input stage is a class AB input stage.

11. The transconductance amplifier of claim 7, wherein said output stage is a current mirror.

12. The transconductance amplifier of claim 7, wherein the first and second input stages are implemented with bipolar transistors.

13. A method of operating a transconductance amplifier, comprising:

providing a differential input signal to first and second transconductance amplifier differential input stages having first and second gain characteristics, respectively, wherein the first transconductance amplifier differential input stage has a first differential input signal gain characteristic that decreases with absolute value of a differential input signal and the second transconductance amplifier differential input stage has a second differential input signal gain characteristic different from the first differential signal gain characteristic and which increases with absolute value of the differential input sinal; and combining the first and second input stages in parallel for summing the gain characteristics of the first and second transconductance amplifier input stages to form a combined input stage having a third gain characteristic with a linear range that is larger than a linear range of either of the first and second gain characteristics; and generating an output signal.

14. The method of claim 13, wherein the first input stage is a differential pair input stage and the second input stage is a class AB input stage.

15. The method of claim 13, wherein the first input stage is a class AB input stage.

* * * * *